(12) United States Patent
Heo et al.

(10) Patent No.: US 6,355,529 B2
(45) Date of Patent: Mar. 12, 2002

(54) METHOD OF FABRICATING MEMORY CELL WITH VERTICAL TRANSISTOR

(75) Inventors: Kuen-Chy Heo, Chiai Hsien; Jeng-Ping Lin, Taoyuan Hsien, both of (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 09/854,696

(22) Filed: May 15, 2001

(30) Foreign Application Priority Data

May 16, 2000 (TW) .......................................... 89109309 A

(51) Int. Cl.[7] .......................................... H01L 21/8242
(52) U.S. Cl. ........................ 438/270; 438/244; 438/589
(58) Field of Search ................................ 438/138, 243, 438/244, 270, 386, 387, 589

(56) References Cited

U.S. PATENT DOCUMENTS

| | | | |
|---|---|---|---|
| 5,466,628 A | * 11/1995 | Lee et al. | 438/244 |
| 6,172,390 B1 | * 1/2001 | Rupp et al. | 438/244 |
| 6,190,971 B1 | * 2/2001 | Gruening et al. | 438/270 |
| 6,225,158 B1 | * 5/2001 | Furukawa et al. | 438/270 |

FOREIGN PATENT DOCUMENTS

JP 11-135757 * 5/1999

* cited by examiner

Primary Examiner—Chandra Chaudhari

(57) ABSTRACT

A method of fabricating a vertical transistor of a memory cell is disclosed. A pad layer is formed on the substrate. A deep trench is formed in the substrate. A trench capacitor is formed in the deep trench. A collar oxide layer is formed on the sidewalls at the upper portion of the trench capacitor. A first conductive layer and a first opening are formed on the trench capacitor. A second conductive layer is formed to fill the first opening. An ARC layer and a photoresist layer are coated and defined to form a second opening. The layers under the second opening are defined to form a third opening. A first insulating layer is formed to fill the third opening. The first insulating layer and the second conductive layer are partially removed to form the shallow trench isolation. The residual second conductive layer is etched back to form a buried strap and a fourth opening. After forming the insulating spacers on the sidewalls of the fourth opening, a second insulating layer is formed on the buried strap. The pad layer and the insulating spacer are removed. A third insulating layer is formed on the substrate. A well is form at the upper portion of the substrate, the third insulating layer is removed. A fourth insulating layer is formed and partially removed to form the gate oxide. Third and fourth conductive layers are formed to fill the fourth opening and defined to form the gate. Source/drain regions and gate spacers are formed.

22 Claims, 12 Drawing Sheets

METHOD OF FABRICATING MEMORY CELL WITH VERTICAL TRANSISTOR

BACKGROUND OF THE INVENTION

1. Field of the Invention

The present invention relates to a method of fabricating memory cell with transistor, and more particularly to a dynamic random access memory (DRAM) cell having a vertical transistor.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the bottom storage electrodes of the adjacent capacitor, forming a memory cell of the DRAM device. A large number of memory cells make up the cell arrays which combine with the peripheral circuit to produce DRAMs.

In recent years, the sizes of the MOSFETs have continuously shrunk so that the packing densities of these DRAM devices have increased considerably. For example, new techniques for manufacturing extremely small transistor elements have been developed for 1 Giga bit DRAMs and beyond. One of the methods of increasing integration is to form a three-dimensional transistor structure, instead of the commonly used planar-type transistor.

Referring to FIG. 1A, a semiconductor substrate 100 is provided. A pad oxide layer 102 is formed on the substrate 104 by using an oxidation process. Then, a pad nitride layer 106 and a BPSG layer (not shown) are formed by LPCVD process on the pad oxide 102. The BPSG layer, the pad nitride layer 106, the pad oxide layer 102 and the substrate 100 are defined to form a deep trench 112 by photolithography and etching process. Then, the BPSG layer is removed. At the lower portion of the trench 112, a trench capacitor (not shown) is formed by using conventional process. Then, a thin collar oxide layer 114 is formed on the sidewalls of the upper portion of the deep trench 112 that are above the trench capacitor. A polysilicon layer 116 is formed and fills up the inner space of the deep trench 112.

Referring to FIG. 1B, the polysilicon layer 116 is etched back until the surface of the polysilicon layer 116 in the deep trench 112 is lower than the surface of the substrate 104. Then, the collar oxide layer 114 over the top surface of the polysilicon 116 is over-etched until the top of the collar oxide layer 114 is lower than the top surface of the polysilicon layer 116.

Referring to FIG. 1C, a doped polysilicon layer (not shown) is deposited on the surface of the pad nitride layer 106 and fills the inner space of the deep trench 112. The doped polysilicon layer on the pad nitride layer 106 is removed by a Chemical Mechanical Polishing (CMP) process. The pad nitride layer 106 acts as an etching stop layer while removing the doped polysilicon layer. Then, the doped polysilicon layer in the deep trench 112 is etched back until the top surface of the doped polysilicon in the deep trench 112 is lower than the surface of the substrate 104 at a predetermined distance. The remained residual doped polysilicon layer in the deep trench 112 forms the buried strap 122.

Referring to FIG. 1D, anti-reflection coating (ARC) layer 124 is deposited on the pad nitride layer 106 and fills the inner space of the deep trench 112. A photoresist layer 126 is coated on the anti-reflection coating layer 124, and then a first opening 128 is defined and formed on the photoresist layer 126 by photolithography.

Referring to FIG. 1E, an opening 130 is formed by anisotropically etching away the anti-reflection coating layer 124, the pad nitride layer 106, oxide layer 102, the buried strap 122, the collar oxide layer 114, the first conductive layer 116 and the substrate 100. The photoresist layer 126 and the residual ARC layer 124 are then removed.

Referring to FIG. 1F, the opening 130 is filled with an insulating layer (not shown) made of high-density plasma oxide. The pad nitride layer 106, the pad oxide layer 102 and a portion of the insulating layer are planarized by a CMP process, and an etch-back process is performed to remove a portion of the insulating layer to the surface 104 of the substrate 100. Then, the pad nitride layer 106 and the pad oxide layer 102 are removed by an etch-back process. Thus the insulating layer in the opening 130 forms the shallow trench isolation (STI) 136. The impurities contained in the buried strap 122 out-diffuse into the substrate 100 to form the source region 131 because of the high temperature during the mentioned manufacturing processes.

Referring to FIG. 1G, a polysilicon layer (not shown), a tungsten silicide layer (not shown) and a nitride layer (not shown) are sequentially deposited on the surface of the substrate 100 and STI 136. Then, the gates 145 and the second word lines 138 are formed on the surface of the substrate 100 and STI 136 by defining the polysilicon layer, the tungsten silicide layer and the nitride layer by photolithography and anisotropic etching. A drain region 125 is formed by using the gates 145 as the mask and implanting N type dopants such as P or As into the substrate 100. Thus, the manufacturing of a memory cell is completed.

Since the packing density of the DRAM increases and the size of the transistors and capacitors continuously scales down, the distance between the source region 131 and the drain region 125 is shortened. Accordingly, the source region 131 tends to overlap with the drain region 125 in the conventional manufacturing process, causing that the gates 145 loss the switching function and the device always turns on. That is, the memory device can not work.

SUMMARY OF THE INVENTION

Accordingly, an object of the present invention is to provide a method for fabricating a semiconductor memory device having a vertical transistor that can prevent the drain region and the source region from short-circuiting.

According to this invention, a new method of fabricating a semiconductor memory device having a vertical transistor is set forth. The vertical transistor is fabricated in the trench instead of on the surface of the substrate. The gate of the transistor is located in the trench and extends to the surface of the substrate and the shallow trench isolation. The source region and the drain region are then fabricated perpendicularly to each other, and will be no longer to overlap with each other. The depth of trench and the location of the gate can be controlled to avoid the overlap of the source region and the drain region. In order to achieve the above object, this invention provides a method of fabricating a vertical transistor of a memory cell which is described below. A semiconductor substrate is first provided. A pad layer is formed on the substrate. Then, a deep trench is formed in the substrate. A trench capacitor is formed at the lower portion of the deep trench. A collar oxide layer is formed on the sidewalls of the upper portion of the deep trench that is above the trench capacitor. A first conductive layer is formed above the trench capacitor with a first predetermined depth in the deep trench, and a part of the collar oxide layer above the first conductive layer is removed to form a first opening.

A second conductive layer is formed to fill the first opening. The pad layer, the substrate, the second conductive layer, the collar oxide layer and the first conductive layer are defined to a second predetermined depth and have a second opening formed thereon. A first insulating layer is formed to fill the second opening and thus forms the shallow trench isolation. A part of the second conductive layer is removed to a third predetermined depth to form a buried strap and a third opening. An insulating spacer is formed on the sidewalls of the third opening. A second insulating layer is formed on the buried strap. Then, the pad layer and the insulating spacer is removed. A third insulating layer is formed on the exposed surface of the substrate, as well as the sidewalls of the third opening. A well at the upper portion of the substrate is formed. Then, the third insulating layer is removed and a fourth insulating layer is formed on the exposed surface of the substrate and the sidewalls of the third opening. The fourth insulating layer on the top surface of the substrate is removed to form the gate oxide. Sequentially, a third conductive layer and a fourth conductive layer are formed to fill the third opening and cover the surface of both the substrate and the shallow trench isolation. Then, the third conductive layer and the fourth conductive layer are defined to form the gate. Finally, the source/drain regions and the gate spacers are formed to complete the fabrication of the vertical transistor of a memory cell.

BRIEF DESCRIPTION OF THE DRAWINGS

The accompanying drawings forms a material part of this description, in which.

DETAILED DESCRIPTION OF THE PREFERRED EMBODIMENT

The invention disclosed herein is directed to a method of fabricating the vertical transistor of DRAMs. In the following description, numerous details are set forth in order to provide a thorough understanding of the present invention. It will be appreciated by ones skilled in the art that variations of these specific details are possible while still achieving the results of the present invention. Well-known processing steps are not described in detail in order not unnecessarily to obscure the present invention.

Figure 1A:
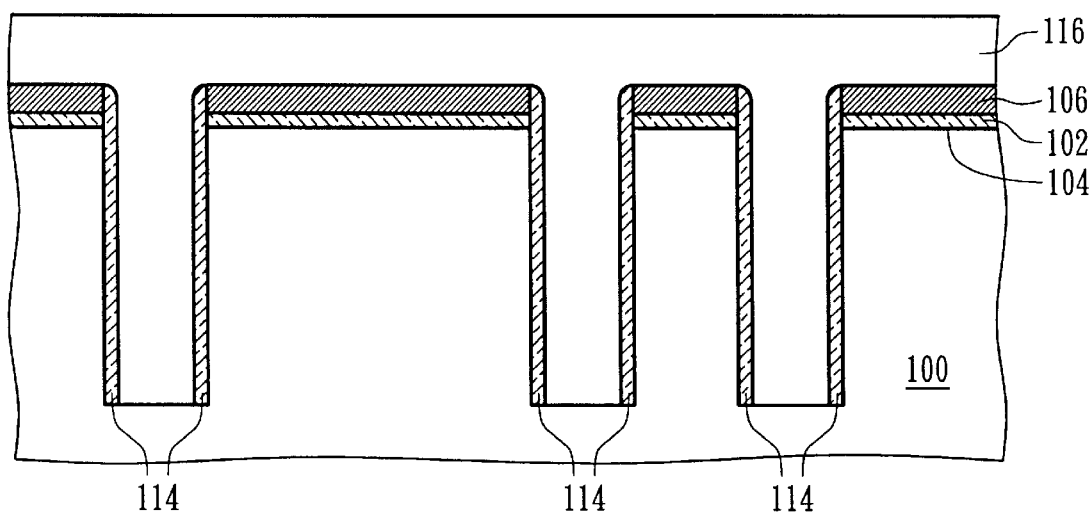
FIGS. 1A through 1G show schematic cross-sectional views of a partially fabricated integrated circuit structure at successive stages in forming a transistor of a DRAM cell of the prior art.
Figure 1B:
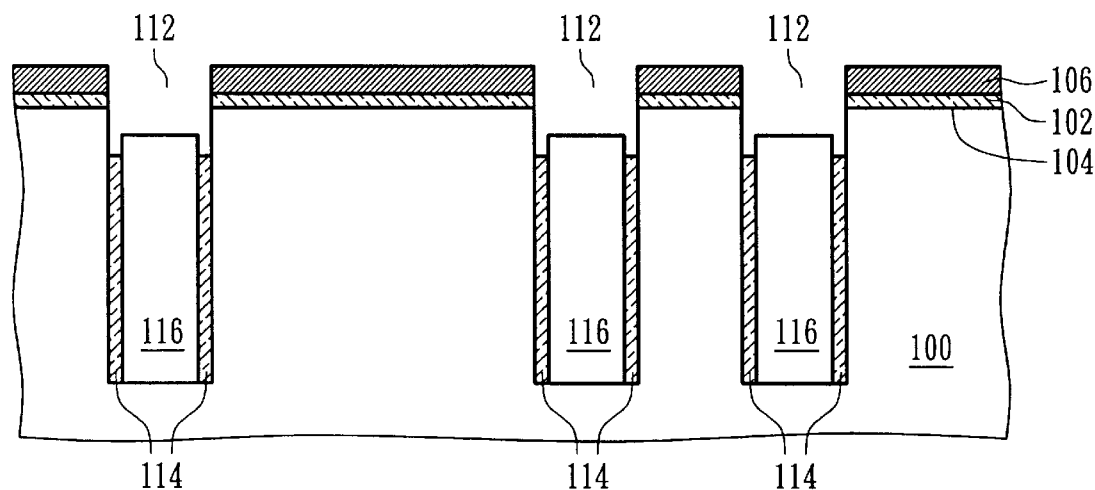
Figure 1C:
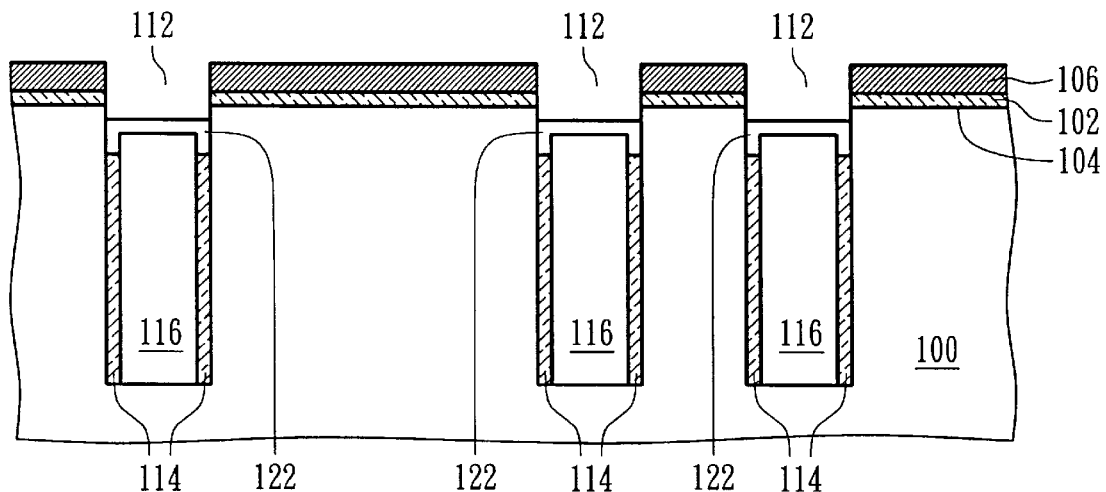
Figure 1D:
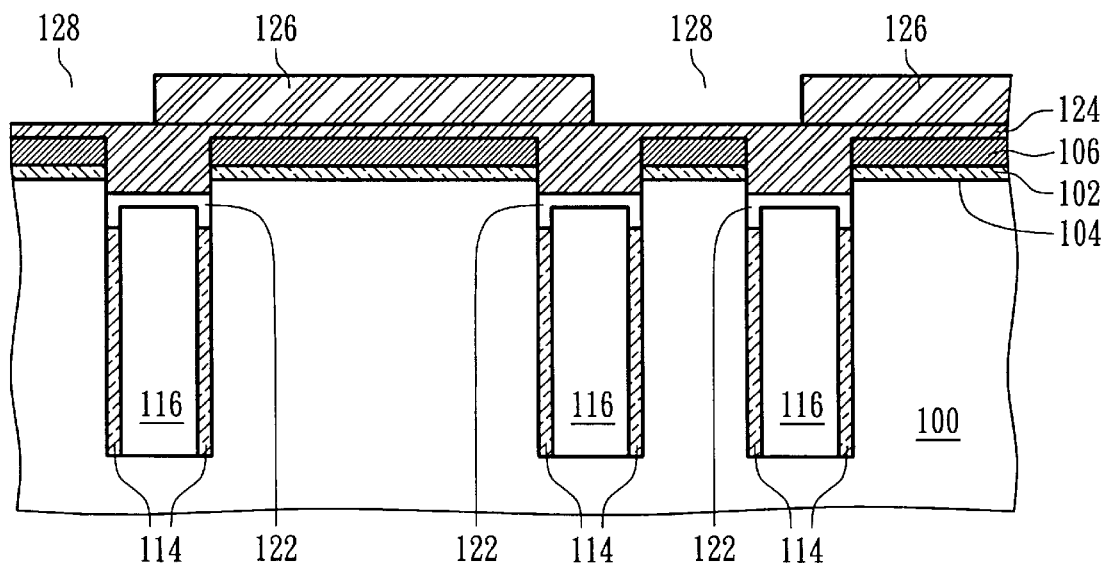
Figure 1E:
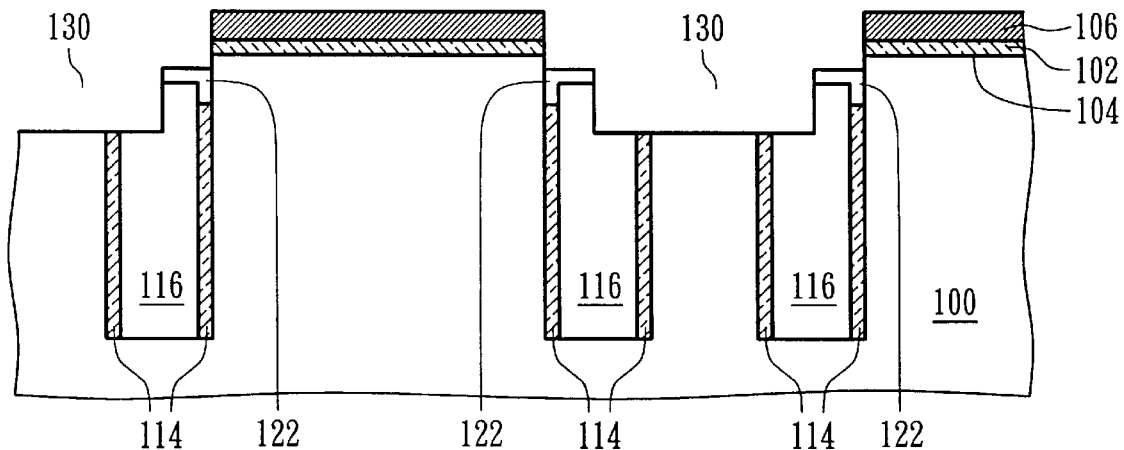
Figure 1F:
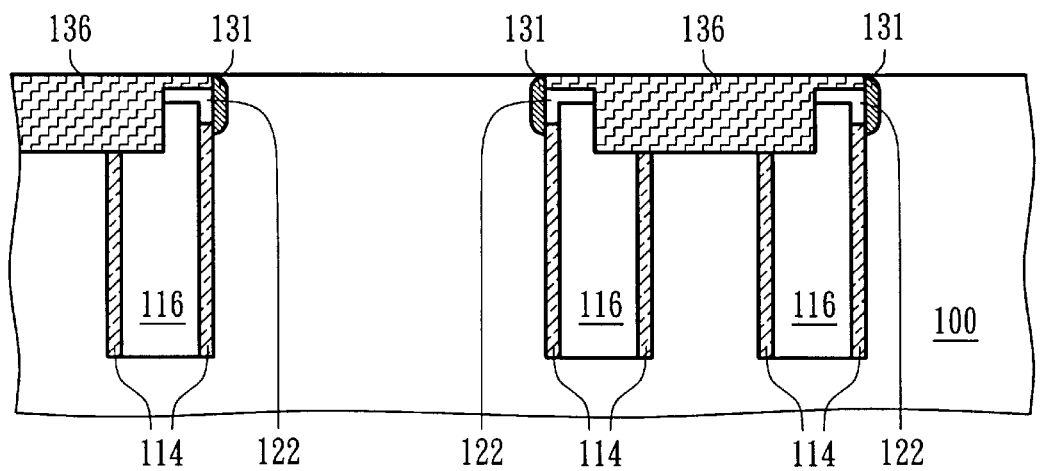
Figure 1G:
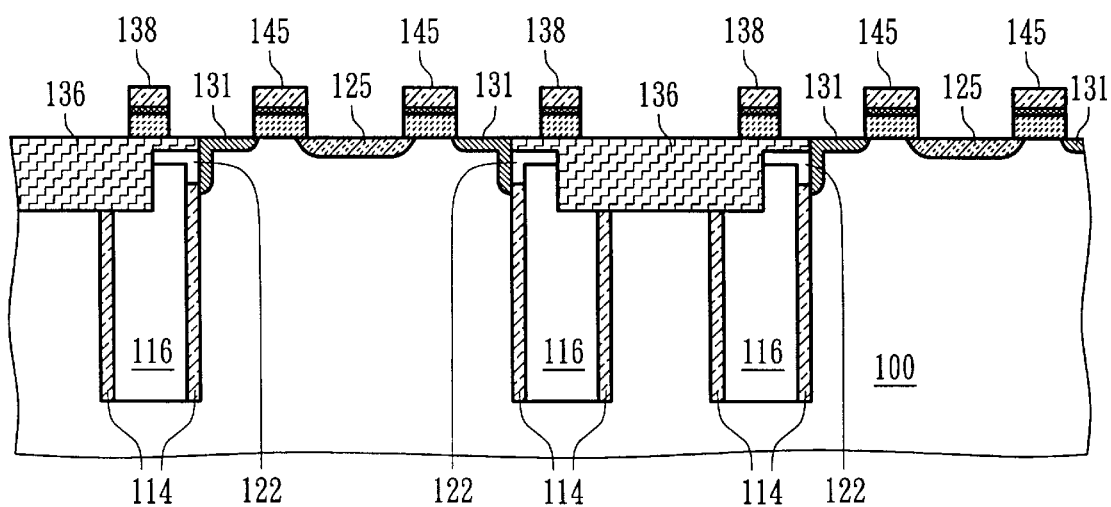
Figure 2A:
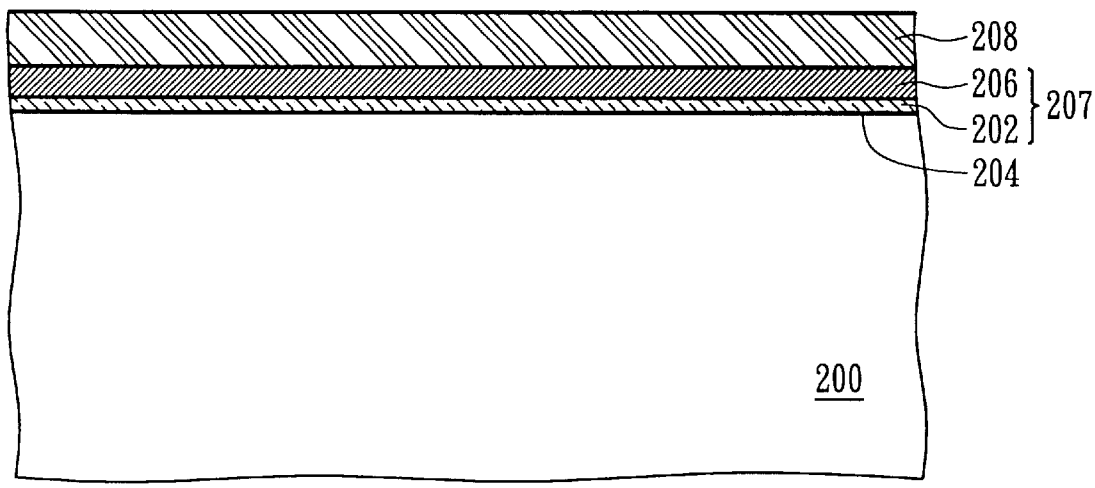
FIGS. 2A through 2P show schematic cross-sectional views of a partially fabricated integrated circuit structure at successive stages in forming a vertical transistor of a DRAM cell according to an embodiment of the present invention.

Referring now to FIG. 2A, a semiconductor substrate 200 is provided. The semiconductor substrate 200 is composed of silicon or germanium. The substrate 200 can be made by epitaxial silicon or silicon on insulator (SOI). For simplicity, a P-type semiconductor silicon substrate 200 is taken as an example in this invention. An oxidation process is used to form a pad oxide layer 202 on the surface of the substrate 204. The thickness of the pad oxide layer 202 is about 150 angstroms. A pad nitride layer 206 is then formed over the pad oxide 206 by CVD process. The thickness of the pad nitride layer 206 is about 1500 to 3000 angstroms. The pad oxide 202 and the pad nitride 206 constitute the pad layer 207. A masking layer 208 is formed over the pad layer 207. The masking layer 208, which has a thickness of about 5000 to 20000 angstroms, is made of boron silicate glass (BSG) by situ doped boron ions in silicate glass. The masking layer 208 can be formed by CVD, APCVD, SAPCVD, LPCVD, PECVD or HDPCVD technique. Thereafter, the masking layer 208 is planarized by thermal reflow, etchback or chemical mechanical polishing (CMP) techniques.

Figure 2B:
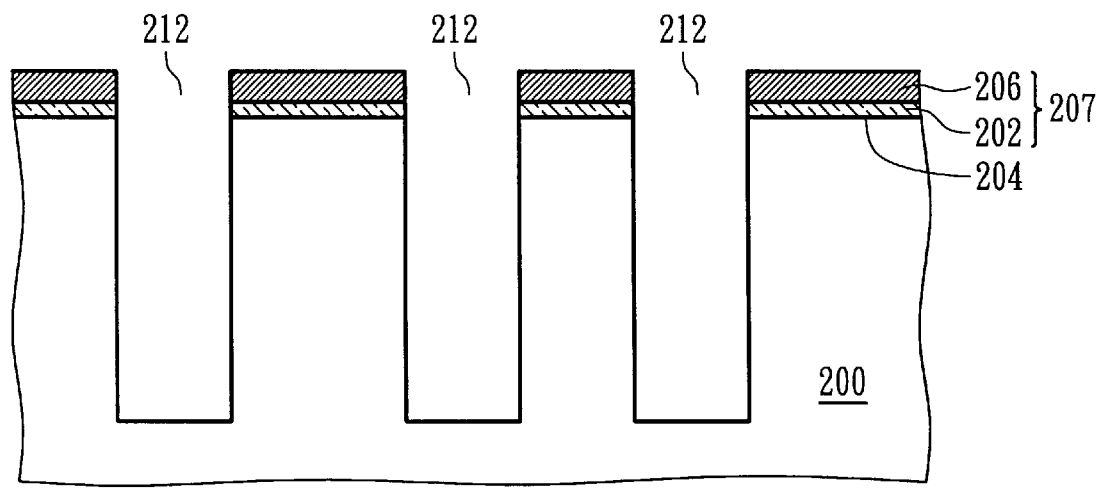

Referring to FIG. 2B, the masking layer 208 is defined by using photolithography and etching process. Then, the pad layer 207 and the substrate 200 are defined to form a deep trench 212 on the substrate 200 by using the masking layer 208 as a mask. After the formation of the deep trench 212, the masking layer 208 is removed by an isotropic etching process, in which the pad layer 207 is used as an etching stop layer. Then, a trench capacitor (not shown), which contains the bottom electrode, dielectric layer and top electrode, is formed at the lower portion of the deep trench 212 by conventional processes.

Figure 2C:
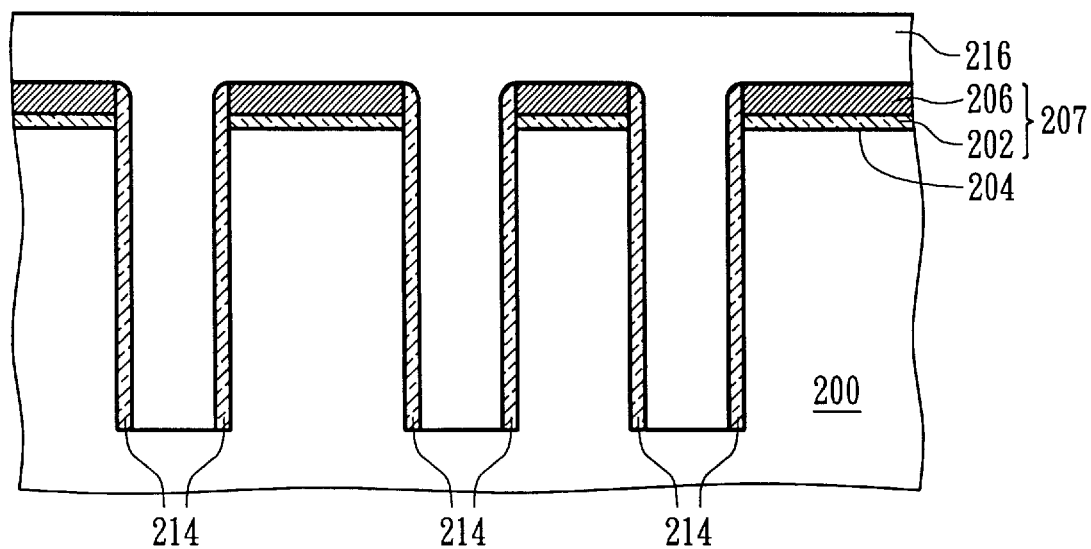

Referring to FIG. 2C, a collar oxide layer 214 is formed on the sidewalls of the upper portion of the deep trench 212 that is above the trench capacitor. The collar oxide layer 214, which can be made of silicon oxide, is formed by CVD technique. The thickness of the collar oxide layer 214 is about 200 to 1000 angstroms. Then, a first conductive layer 216 is formed on the pad layer 207 and fills the inner space of the deep trench 212. The first conductive layer 216 is usually composed of doped polysilicon that is doped with arsenic ions or phosphorus ions. The first conductive layer 216 is formed by LPCVD technique and has a thickness of 2500 to 4000 angstroms.

Figure 2D:
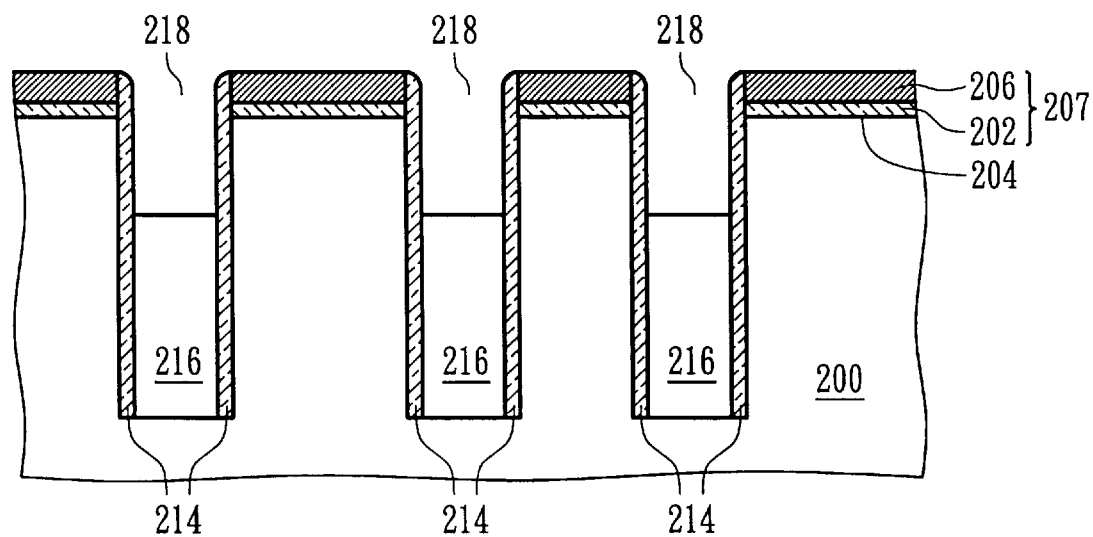

Referring to FIG. 2D, using the pad layer 207 as an etch stop layer, the first conductive layer 216 above the pad layer 207 is removed by a planarization process, such as chemical mechanical polishing (CMP) techniques. Then, an etch-back process is performed to partially remove the first conductive layer 216 in the deep trench 212 to a first predetermined depth to form a first opening 218 in the deep trench 212. The top surface of the residual first conductive layer 216 is lower than the surface 204 of the substrate 200. The first predetermined depth is 2500 to 5500 angstroms beneath the surface of the substrate.

Figure 2E:
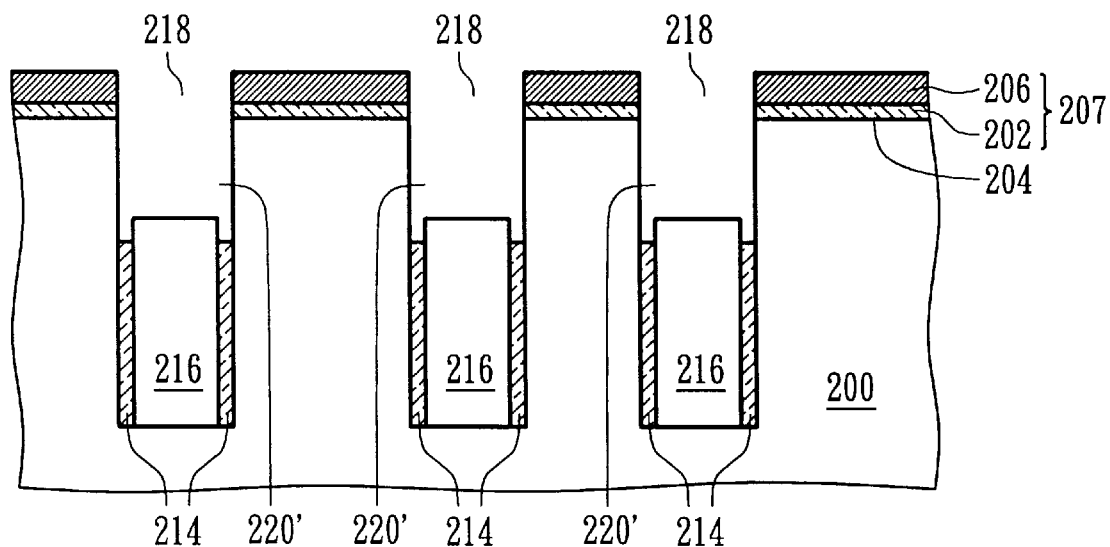

Referring to FIG. 2E, an overetch process is performed to remove a part of the collar oxide layer 214 until the top surface of the collar oxide layer 214 is lower than the top surface of the first conductive layer 216.

Figure 2F:
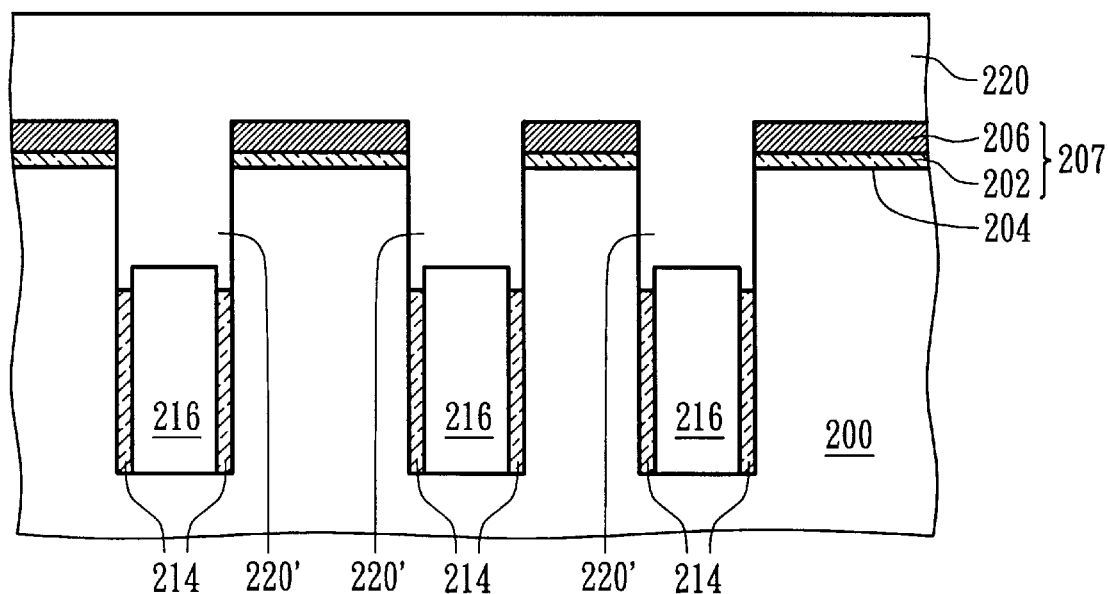

Referring to FIG. 2F, a second conductive layer 220, which has a thickness of 2500~4000 angstroms, is formed on the pad layer 207 and fills the first opening 218. The second conductive layer 220 is usually made of polysilicon doped with arsenic ions or phosphorus ions and is formed by LPCVD technique.

Figure 2G:
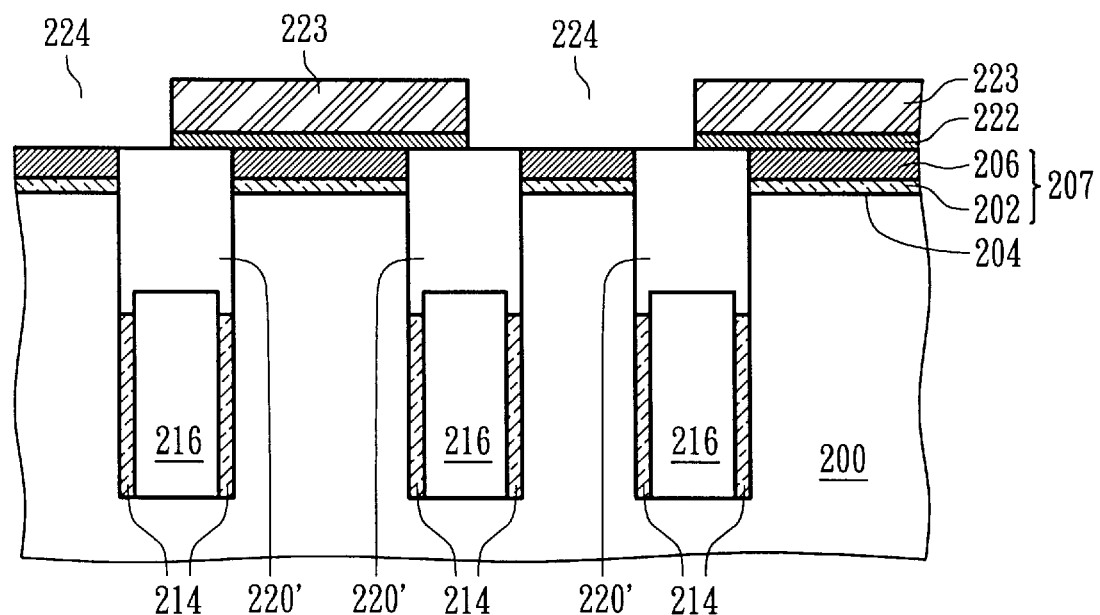

Referring to FIG. 2G, using the pad layer 207 as an etch stop layer, the second conductive layer 220 on the pad layer 207 is removed by a planarization process such as chemical mechanical polishing (CMP) techniques. An ARC layer 222 and a photoresist layer 223 are coated on the pad layer 207 and the residual second conductive layer 220'. Then, the ARC layer 222 and the photoresist layer 223 are defined to form a second opening 224.

Figure 2H:
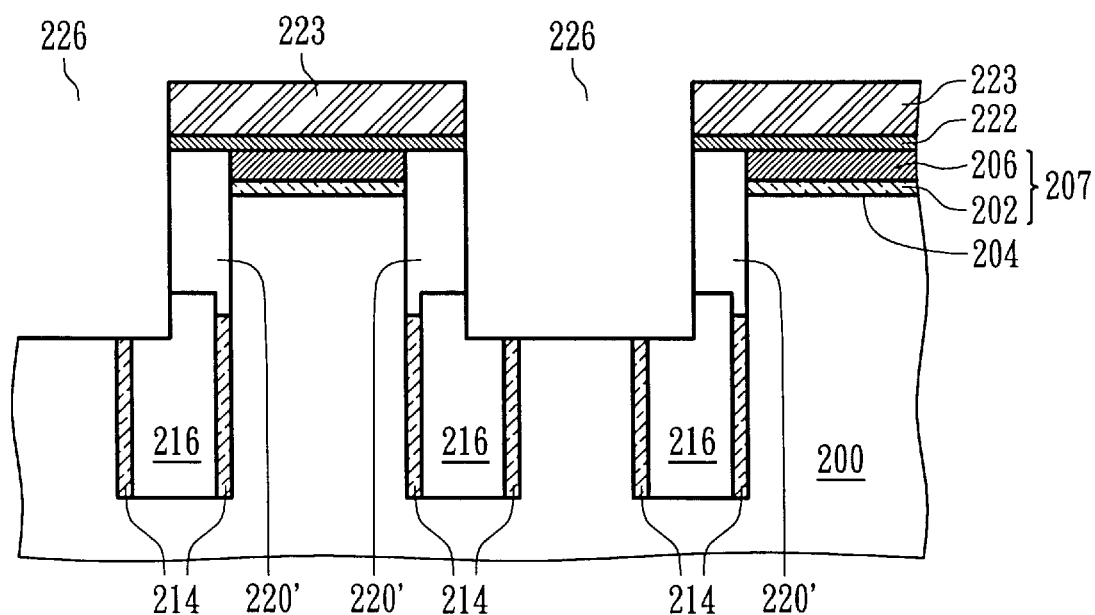

Referring to FIG. 2H, the layers under the opening 224, such as: the pad layer 207, the substrate 200, the residual second conductive layer 220', the collar oxide layer 214 and the first conductive layer 216 are defined to a second predetermined depth by photolithography and etching to form a third opening 226. The second predetermined depth is about 3000 to 6000 angstroms beneath the surface of the substrate 204. Thereafter, the ARC layer 222 and the photoresist layer 223 are removed.

Figure 2I:
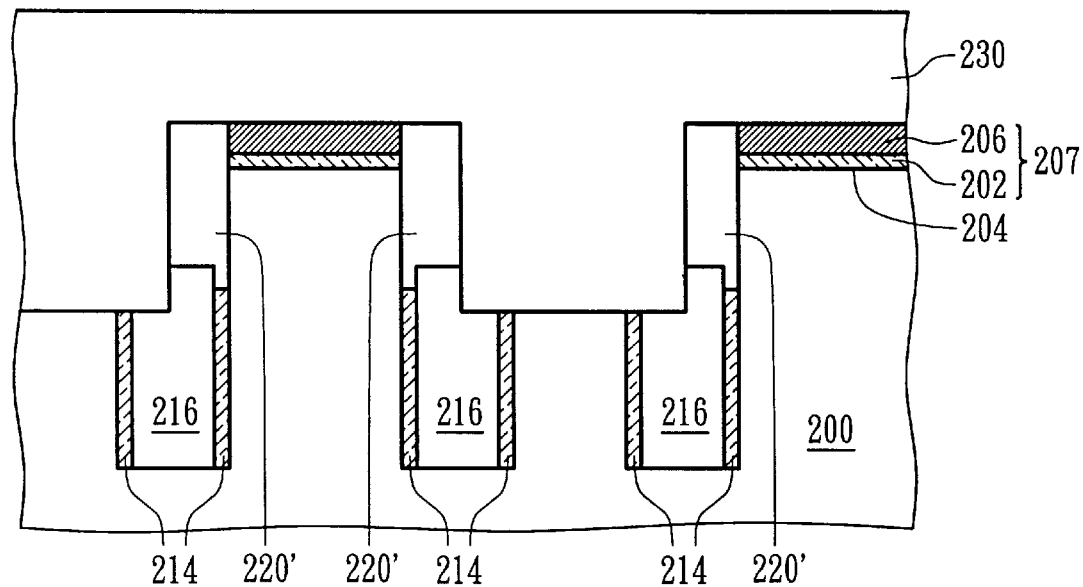

Referring to FIG. 2I, a first insulating layer 230 is formed on the pad layer 207 and the residual second conductive layer 220' and fills the third opening 226. The first insulating layer 230 is made of HDP (High Density Plasma) oxide which is formed by HDPVCD technique and has a thickness of about 4000 to 7000 angstroms.

Figure 2J:
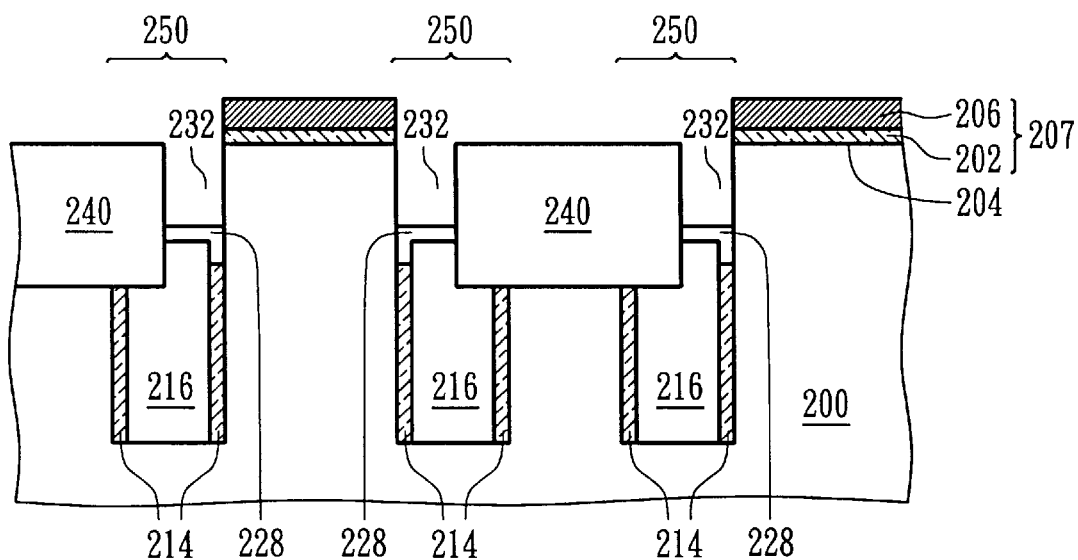

Referring to FIG. 2J, a planarization process, such as the CMP process, is used to remove the first insulating layer 230 above the pad layer 207 and the residual second conductive layer 220'. Then, a wet etch process is performed to partially remove the residual first insulating layer 230 to form the Shallow Trench Isolation 240. Next, the residual second conductive layer 220' is etched back to a third predetermined depth to form the buried strap 228. The opening formed above the buried strap 228 is the fourth opening 232. The third predetermined depth is about 2000 to 5000 angstroms beneath the surface of the substrate 204.

Figure 2K:
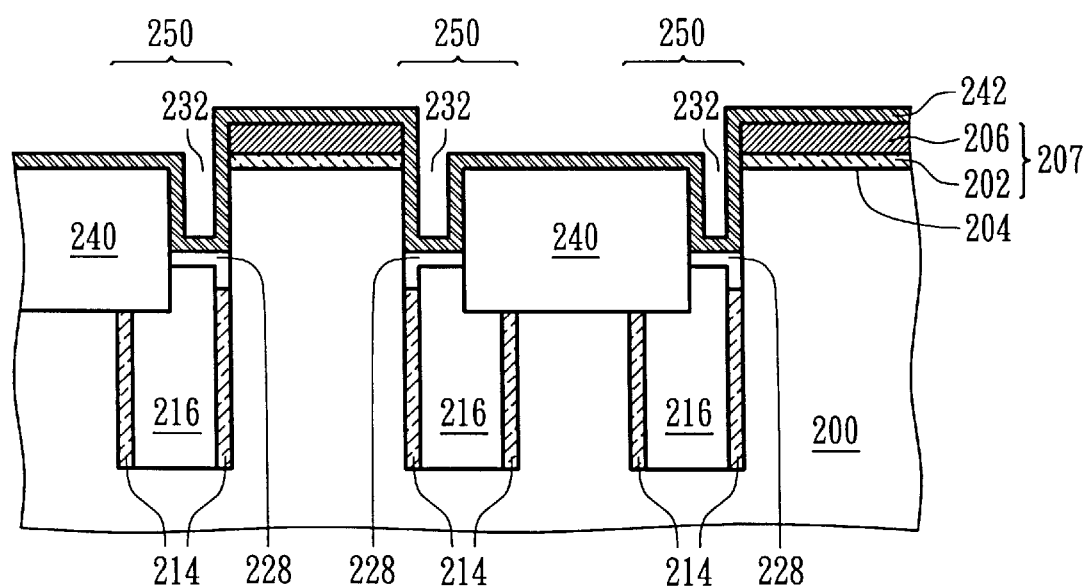

Referring to FIG. 2K, a second insulating layer 242 is formed on the pad layer 207 and the Shallow Trench Isolation 240 and conformally extends into the fourth opening 232 to cover the sidewalls and bottom of the fourth opening 232. The second insulating layer 242, which is usually made of silicon nitride, has a thickness of around 100 to 200 angstroms and can be formed by LPCVD.

Figure 2L:
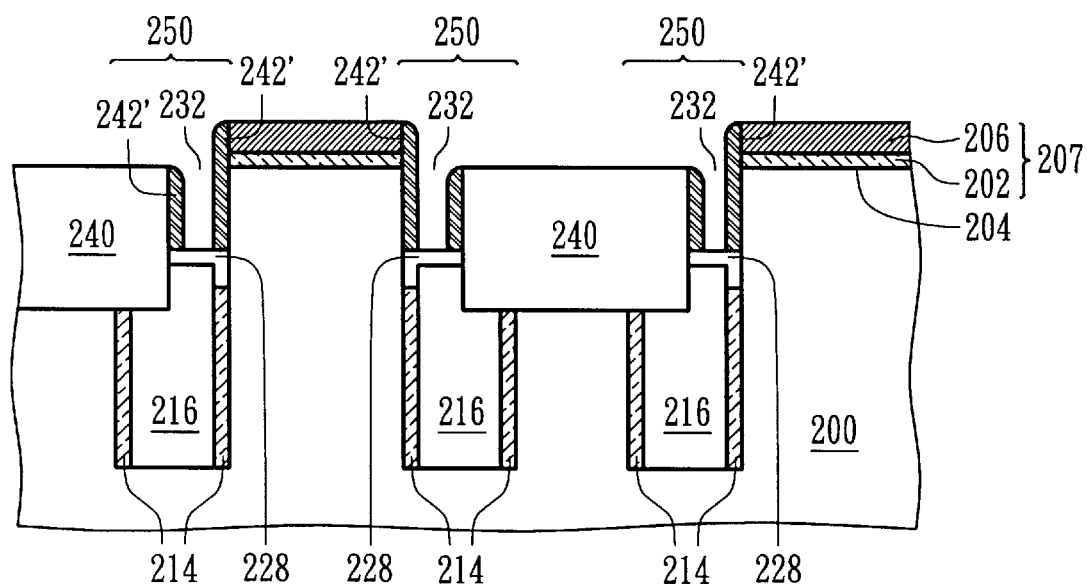

Referring to FIG. 2L, insulating spacers 242' are formed on the sidewalls of the fourth openings 232 by etching back the second insulating layer 242.

Figure 2M:
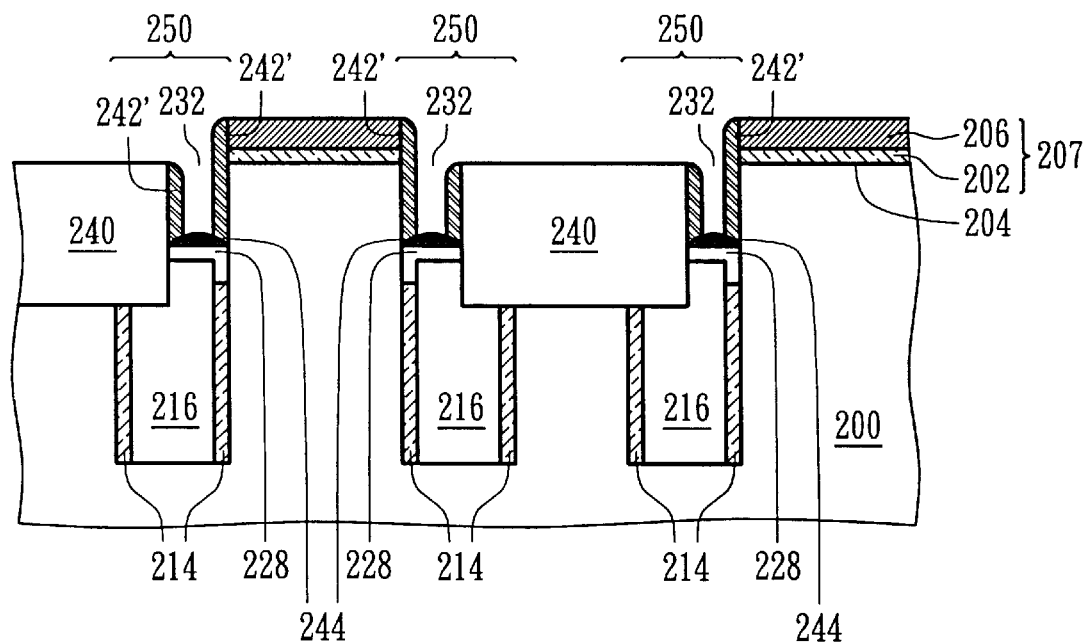

Referring to FIG. 2M, a third insulating layer 244 is formed on the buried strap 228. The third insulating layer 244 is usually a thermal oxide layer which is formed by thermal oxidation technique and has a thickness of about 300 to 600 angstroms. The thermal oxide layer is not formed on the sidewalls of the fourth openings 232 since they are protected by the insulating spacers 242'.

Figure 2N:
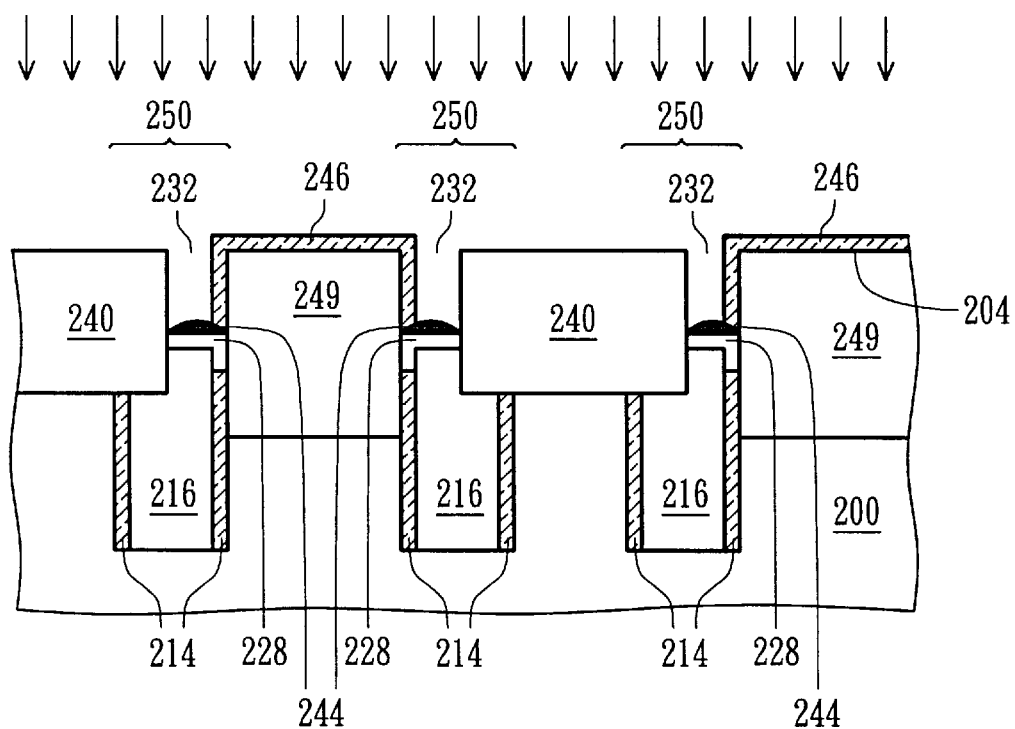

Referring to FIG. 2N, the pad layer 207 and the insulating spacer 242' are removed by an etching process. The etching process can be an isotropic wet etching process. A fourth insulating layer 246 is formed on the exposed surface of the substrate 204 as well as the sidewalls of the fourth opening 232. The fourth insulating layer 246 is made of thermal oxide layer, which is formed by a rapid thermal oxidation process. The thickness of the fourth insulating layer 246 is about 50 to 150 angstroms. Then, the conventional technique is used to dope some ions into the substrate 200 to form a well 249 at the upper portion of the substrate 200. The purpose of forming the fourth insulating layer 246 is to protect the surface of the substrate 204 from being destroyed by the ion bombardment. The other purpose of forming the fourth insulating layer 246 is to prevent surface of the substrate 204 from channeling effect so that the depth and the ions concentration of implantation can be controlled.

Figure 2O:
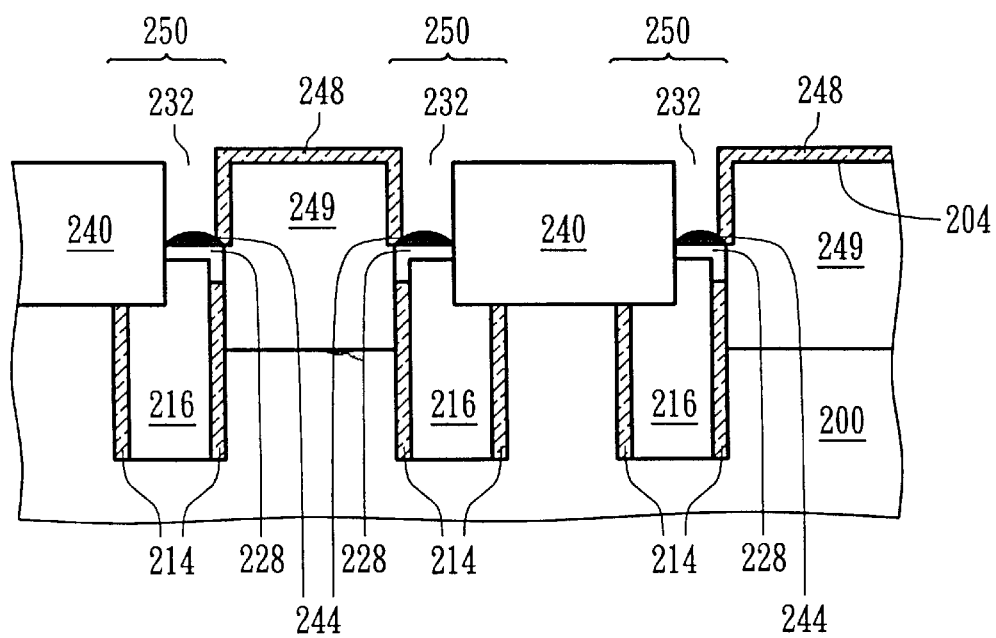

Referring to FIG. 2O, the fourth insulating layer 246 is removed by an etching process such as an anisotropic etching process. Then, a fifth insulating layer 248 is formed on the well 249. The fifth insulating layer 248 is preferably an thermal oxide layer formed by thermal oxidation and has a thickness of 50 to 150 angstroms.

Figure 2P:
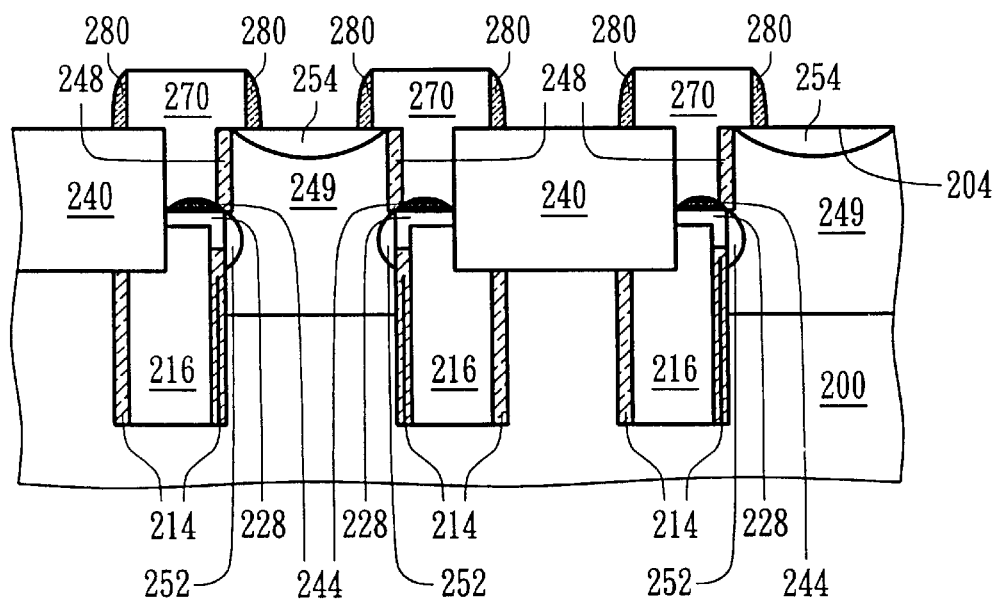

Referring to FIG. 2P, the fifth insulating layer 248 on the top surface 204 of the substrate is removed by an etching process. The fifth insulating layer 248 left in the fourth opening 232 becomes the gate oxide 260. The etching process is preferably the isotropic etching process. Then, a third conductive layer (not shown) having a thickness of about 650 to 1000 angstroms and a fourth conductive layer (not shown) having a thickness of about 500 to 900 angstroms are formed to fill the fourth opening 232 and cover the surface 204 of the substrate and the Shallow Trench Isolation 240. The third conductive layer, which is made of doped polysilicon, can be formed by LPCVD and doped with Arsenic ions or Phosphorus ions by diffusion or implantation techniques. The fourth conductive layer, which is made of Tungsten Silicide, can be formed by CVD process. Afterwards, the third and fourth conductive layers are defined by photolithography and etching to form the gate 270 conductive layer. A drain region 254 is formed after the formation of the gate 270. The impurities contained in the buried strap 228 out-diffuse into the substrate 200 because of the high temperature of the above-mentioned processes to form the source region 252. The source region 252 is beneath the surface of the substrate 204 and is vertically to the drain region 254. The gate spacers 280, which can be made of silicon nitride or silicon oxide, are formed on the sidewalls of the gate 270 by CVD techniques.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating memory cell with vertical transistor, comprising:

providing a semiconductor substrate;

forming a pad layer on a surface of the substrate;

forming a deep trench in the substrate;

forming a trench capacitor at the lower portion of the deep trench;

forming a collar oxide layer on sidewalls at the upper portion of the deep trench that is above the trench capacitor;

forming a first conductive layer above the trench capacitor and fills the deep trench;

partially removing the first conductive layer to a first predetermined depth in the deep trench to form a first opening;

removing a part of the collar oxide layer until the top surface of the collar oxide layer is lower than the top surface of the first conductive layer;

forming a second conductive layer to fill the first opening;

defining the pad layer, the substrate, the second conductive layer, the collar oxide layer and the first conductive layer to a second predetermined depth to form a second opening;

forming a first insulating layer to fill the second opening and form a shallow trench isolation;

partially removing the second conductive layer to a third predetermined depth to form a buried strap and a third opening;

forming insulating spacers on sidewalls of the third opening;

forming a second insulating layer on the buried strap;

removing the pad layer and the insulating spacers;

forming a third insulating layer on the exposed surface of the substrate and the sidewalls of the third opening;

forming a well at the upper portion of the substrate;

removing the third insulating layer and forming a fourth insulating layer on the well;

removing the fourth insulating layer on the top surface of the well to form a gate oxide;

sequentially forming a third conductive layer and a fourth conductive layer to fill the third opening and cover the surface of both the substrate and the shallow trench isolation;

defining the third conductive layer and the fourth conductive layer to form a gate;

forming source and drain regions; and forming gate spacers.

2. The method of claim 1, wherein the semiconductor substrate is made of silicon.

3. The method of claim 1, wherein the pad layer is composed of a pad nitride layer and a pad oxide layer.

4. The method of claim 1, wherein the first conductive layer is made of polysilicon doped with arsenic ions or phosphorus ions.

5. The method of claim 1, wherein the first conductive layer has a thickness of 2500 to 4000 angstroms.

6. The method of claim 1, wherein the second conductive layer is made of polysilicon doped with arsenic ions or phosphorus ions.

7. The method of claim 1, wherein the second conductive layer has a thickness of 2500 to 4000 angstroms.

8. The method of claim 1, wherein the first predetermined depth is 2500 to 5500 angstroms beneath the surface of the substrate.

9. The method of claim 1, wherein the second predetermined depth is 3000 to 6000 angstroms beneath the surface of the substrate.

10. The method of claim 1, wherein the third predetermined depth is 2000 to 5000 angstroms beneath the surface of the substrate.

11. The method of claim 1, wherein the first insulating layer is made of high density plasma oxide.

12. The method of claim 1, wherein the first insulating layer has a thickness of 4000 to 7000 angstroms.

13. The method of claim 1, wherein the insulating spacers are made of silicon nitride.

14. The method of claim 1, wherein the second insulating layer is made of thermal oxide, which is formed by thermal oxidation process.

15. The method of claim 1, wherein the second insulating layer has a thickness of 300 to 600 angstroms.

16. The method of claim 1, wherein the third insulating layer is made of thermal oxide by rapid thermal oxidation process.

17. The method of claim 1, wherein the third insulating layer has a thickness of 50 to 150 angstroms.

18. The method of claim 1, wherein the fourth insulating layer is made of thermal oxide layer, which is formed by thermal oxidation process.

19. The method of claim 1, wherein the fourth insulating layer has a thickness of 50 to 150 angstroms.

20. The method of claim 1, wherein the third conductive layer is made of doped polysilicon.

21. The method of claim 1, wherein the third conductive layer has a thickness of about 650 to 1000 angstroms.

22. The method of claim 1, wherein the fourth conductive layer has a thickness of about 500 to 900 angstroms.

* * * * *